(12) United States Patent
Takesako et al.

(10) Patent No.: US 10,074,654 B1
(45) Date of Patent: Sep. 11, 2018

(54) DYNAMIC RANDOM ACCESS MEMORY

(71) Applicant: Winbond Electronics Corp., Taichung (TW)

(72) Inventors: Kazuaki Takesako, Kanagawa (JP);
Kazutaka Manabe, Kanagawa (JP);
Noriaki Ikeda, Kanagawa (JP);
Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/942,439

(22) Filed: Mar. 31, 2018

Related U.S. Application Data

(62) Division of application No. 15/629,758, filed on Jun. 22, 2017, now Pat. No. 9,972,626.

(51) Int. Cl.
*H01L 27/108* (2006.01)

(52) U.S. Cl.
CPC .... *H01L 27/10808* (2013.01); *H01L 27/1085* (2013.01); *H01L 27/10873* (2013.01)

(58) Field of Classification Search
CPC .......... H01L 27/10808; H01L 27/1085; H01L 27/10873
See application file for complete search history.

(56) References Cited

U.S. PATENT DOCUMENTS

| | | | | |
|---|---|---|---|---|
| 8,298,892 B1* | 10/2012 | Lee | ...................... | H01L 27/105 257/E21.655 |
| 2005/0230734 A1* | 10/2005 | Ha | .................... | H01L 27/10817 257/306 |
| 2007/0057301 A1* | 3/2007 | Wang | ................ | H01L 21/28114 257/296 |
| 2007/0235801 A1* | 10/2007 | Cheng | ..................... | H01L 21/84 257/330 |
| 2013/0187220 A1* | 7/2013 | Surthi | ................... | H01L 21/764 257/329 |
| 2014/0048859 A1* | 2/2014 | Nakano | ............... | H01L 29/4975 257/296 |
| 2015/0171014 A1* | 6/2015 | Park | .................. | H01L 21/76814 257/379 |
| 2016/0086955 A1* | 3/2016 | Wu | .................... | H01L 27/10814 257/306 |
| 2017/0062436 A1* | 3/2017 | Guillorn | ................. | H01L 28/40 |

* cited by examiner

*Primary Examiner* — Walter H Swanson
(74) *Attorney, Agent, or Firm* — JCIPRNET

(57) ABSTRACT

Provided is a dynamic random access memory. A plurality of isolation structures is disposed in a substrate to define a plurality of active regions arranged along a first direction. The substrate has a trench extended along the first direction and passing through the plurality of isolation structures and the plurality of active regions. A buried word line is disposed in the trench. A plurality of gate dielectric layers is disposed in the trench of the plurality of active regions to surround and cover the buried word line. A cap layer covers the buried word line. The height of the top surface of the second side of the buried word line is lower than the height of the top surface of the first side of the buried word line passing through the plurality of active regions and the plurality of isolation structures.

10 Claims, 14 Drawing Sheets

DYNAMIC RANDOM ACCESS MEMORY

CROSS-REFERENCE TO RELATED APPLICATION

This application is a divisional application of U.S. application Ser. No. 15/629,758, filed on Jun. 22, 2017, now allowed. The entirety of the above-mentioned patent application is hereby incorporated by reference herein and made a part of the specification.

BACKGROUND OF THE INVENTION

Field of the Invention

The invention relates to a dynamic random access memory.

Description of Related Art

As the design size of the dynamic random access memory becomes smaller, the semiconductor apparatus is constantly developed to have higher density, and the performance of the dynamic random access memory, in particular refresh performance, is affected by gate-induced drain leakage (GIDL). Therefore, how to effectively reduce GIDL is an important research topic in the art.

SUMMARY OF THE INVENTION

The invention provides a dynamic random access memory that can reduce gate-induced drain current to improve the refresh performance thereof.

An embodiment of the invention provides a dynamic random access memory including a substrate, a plurality of isolation structures, a buried word line structure, a plurality of gate dielectric layers, and a cap layer. The plurality of isolation structures is located in the substrate to define a plurality of active regions arranged along a first direction. The substrate has a trench extended along the first direction and passing through the plurality of isolation structures and the plurality of active regions. The buried word line is disposed in the trench of the substrate. The buried word line is extended along the first direction and passes through the plurality of active regions and the plurality of isolation structures. The plurality of gate dielectric layers is located in the plurality of active regions to cover the surface of a portion of the trench and surround and cover the buried word line. The cap layer covers the buried word line. The height of the top surface of the second side of the buried word line is lower than the height of the top surface of the first side of the buried word line passing through the plurality of active regions and the plurality of isolation structures.

Based on the above, a dynamic random access memory of an embodiment of the invention can reduce gate-induced drain current to improve the refresh performance thereof.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 5A are top views of the first embodiment of the method of fabricating a dynamic random access memory according to the invention.

FIG. 1B to FIG. 5B are respectively cross-sectional diagrams along line B-B' in FIG. 1A to FIG. 5A.

FIG. 1C to FIG. 5C are respectively cross-sectional diagrams along line C-C' in FIG. 1A to FIG. 5A.

FIG. 2D to FIG. 3D are respectively cross-sectional diagrams along line B-B' in FIG. 2A to FIG. 3A according to some exemplary embodiments of the invention.

DESCRIPTION OF THE EMBODIMENTS

Figure 1A:
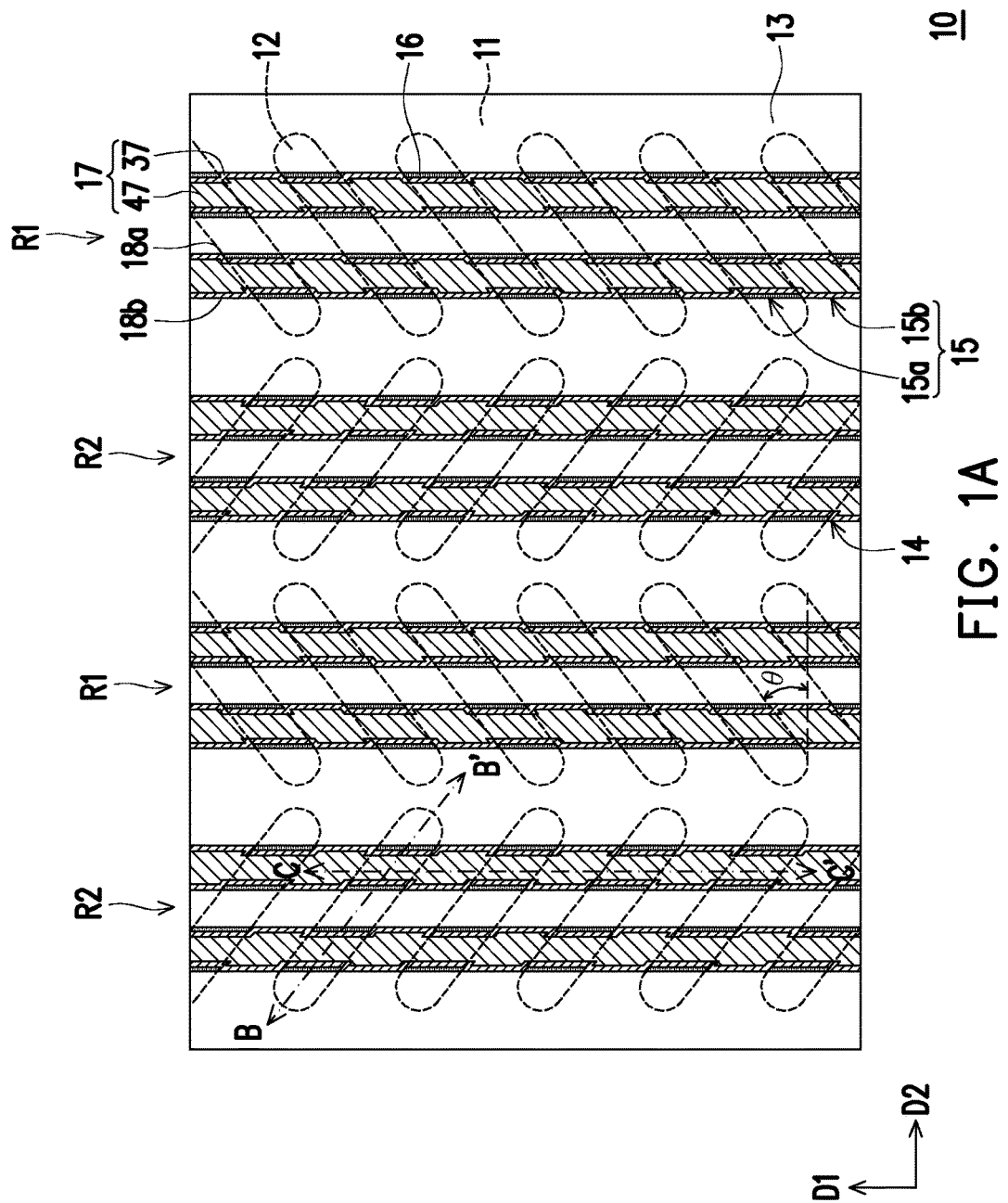

Hereinafter, embodiments of the invention are described in detail with reference to figures. In different embodiments below, the same reference numerals represent the same components in the figures and descriptions, and for simplicity, the materials and forming methods . . . etc. thereof are not repeated.

Figure 1B:
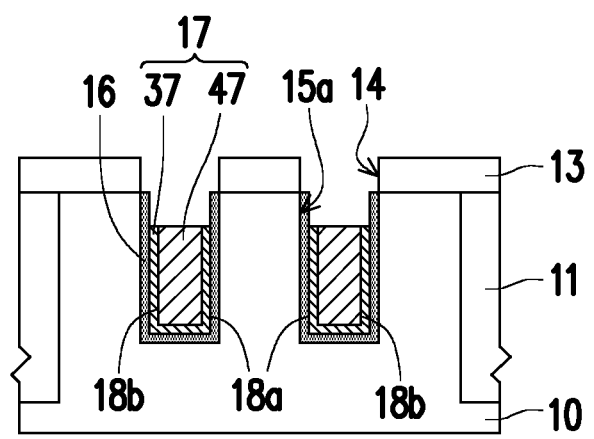
Figure 1C:
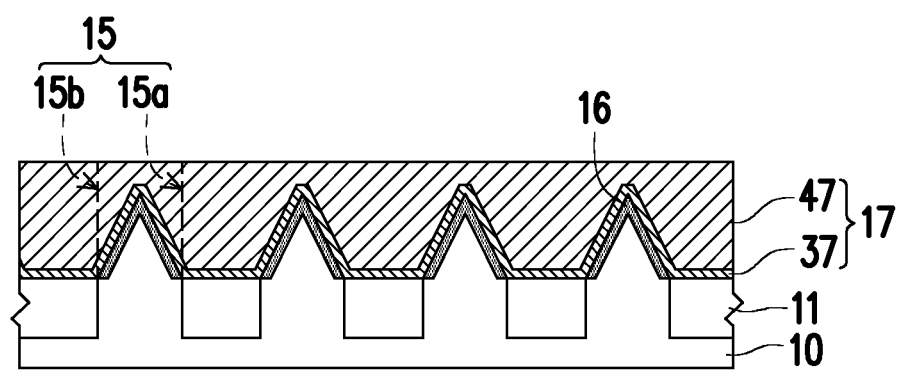

Referring to FIG. 1A, FIG. 1B, and FIG. 1C, a substrate 10 is provided, and the substrate 10 is, for instance, a semiconductor substrate, a semiconductor compound, or a semiconductor alloy.

Next, isolation structures 11 are formed on the substrate 10 to define a plurality of active regions 12. The isolation structures 11 and the active regions 12 are alternately arranged in a first direction D1.

Referring to FIG. 1A, in some embodiments, the active regions 12 are strips and arranged in an array. Two adjacent columns of the active regions 12 are, for instance, disposed as mirror images of each other. For instance, R1 and R2 in FIG. 1 are two active region columns R1 and R2 of the substrate 10. In the active region column R1, the length direction of the active regions 12 and a second direction D2 are non-orthogonal and form an angle θ. In the active region column R2, the length direction of the active regions 12 and the second direction D2 are non-orthogonal and form an angle (180°-θ). However, the invention is not limited thereto, and two adjacent active region columns R1 and R2 can also be disposed as non-mirror images.

Referring to FIG. 1A and FIG. 1B, a patterned hard mask layer 13 is formed on the substrate 10. The patterned hard mask layer 13 has an opening 14. The opening 14 is extended along the first direction D1 and exposes a portion of the isolation structures 11 and a portion of the active regions 12 alternately arranged.

Referring further to FIG. 1A, FIG. 1B, and FIG. 1C, a portion of the isolation structures 11 exposed by the opening 14 and a portion of the substrate 10 in the active regions 12 are removed using the patterned hard mask layer 13 as a mask to form a trench 15. Referring to FIG. 1C, the trench 15 is extended along the first direction D1 and includes a first trench 15a located in the active regions 12 and a second trench 15b located in the isolation structures 11, and the first trench 15a and the second trench 15b are connected to each other. In some embodiments, the bottom surface of the first trench 15a located in the active regions 12 is a non-planar surface and is a convex structure such as a triangle cone. The bottom surface of the second trench 15b is, for instance, a planar surface. However, the invention is not limited thereto, and the bottom surfaces of the first trench 15a and the second trench 15b can both be planar or non-planar surfaces.

Referring further to FIG. 1A, FIG. 1B, and FIG. 1C, next, a gate dielectric layer 16 is formed on the surface of the substrate 10 exposed by the first trench 15a in the active regions 12. The gate dielectric layer 16 covers the bottom surface and the sidewall of the first trench 15a. In some embodiments, the gate dielectric layer 16 further covers the surface (not shown) of the patterned hard mask layer 13. The material of the gate dielectric layer 16 includes an insulation material. The insulation material is, for instance, silicon oxide. The forming method thereof is, for instance, a thermal oxidation method or a CVD.

Then, a buried word line 17 is formed in the trench 15. The buried word line 17 can be a single-layer or multilayer structure. In some embodiments, the buried word line 17 is a two-layer structure including a first conductive layer 37 and a second conductive layer 47. The first conductive layer 37 surrounds and covers the bottom surface and the sidewall of the second conductive layer 47. The first conductive layer 37 can be used as an adhesive layer or a barrier layer. The material of the first conductive layer 37 is, for instance, metal nitride such as titanium nitride or tantalum nitride. The material of the second conductive layer 47 is, for instance, metal or metal alloy such as tungsten, aluminum, copper, or an alloy thereof. The method of forming the buried word line 17 includes, for instance, forming a first conductive material layer and a second conductive material layer on the substrate 10 in order using a CVD or a physical vapor deposition. The first conductive material layer and the second conductive material layer cover the surface of the substrate 10 and is filled in the trench 15. Next, the surface of the substrate 10 and a portion of the first conductive material layer and the second conductive material layer in a portion of the trench 15 are removed by, for instance, an etch-back method to form the first conductive layer 37 and the second conductive layer 47.

Referring to FIG. 1A to FIG. 1C, the buried word line 17 is located in the substrate 10, extended along the first direction D1, passes through the active regions 12 and the isolation structures 11, and arranged along the second direction D2. Referring to FIG. 1A, in some embodiments, two buried word lines 17 pass through the same active region column R1 or R2. Two adjacent sides of the two buried word lines 17 are respectively a first side (or inside) 18a; and the other side corresponding to the first side 18a is a second side (or outside) 18b of the buried word line 17. The bottom surface, the sidewalls of the first side 18a and the second side 18b of the buried word line 17 in the active regions 12 are surrounded and covered by the gate dielectric layer 16. The bottom surface, the sidewalls of the first side 18a and the second side 18b of the buried word line 17 in the isolation structures 11 are surrounded and covered by the isolation structures 11.

Figure 2A:
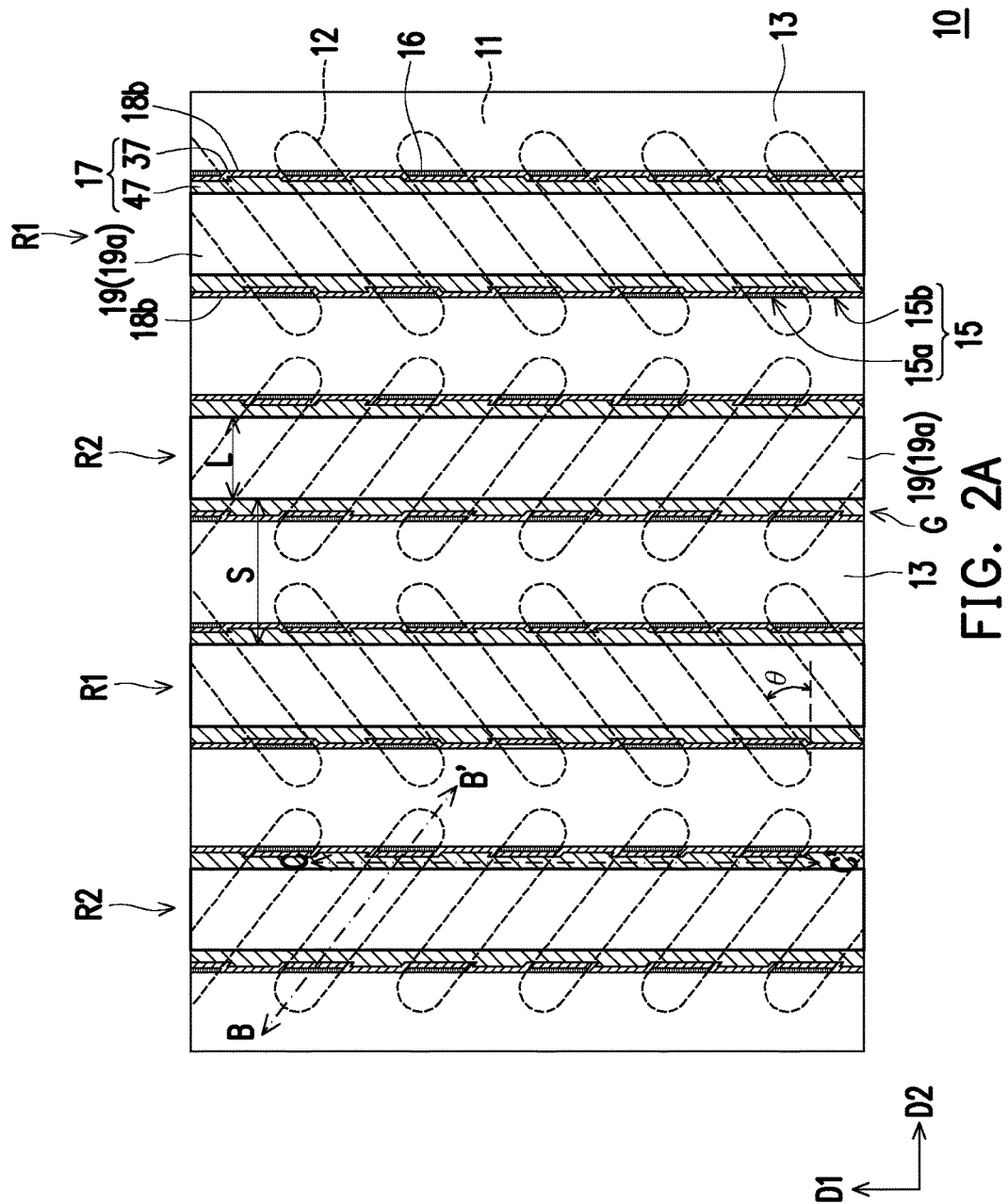
Figure 2B:
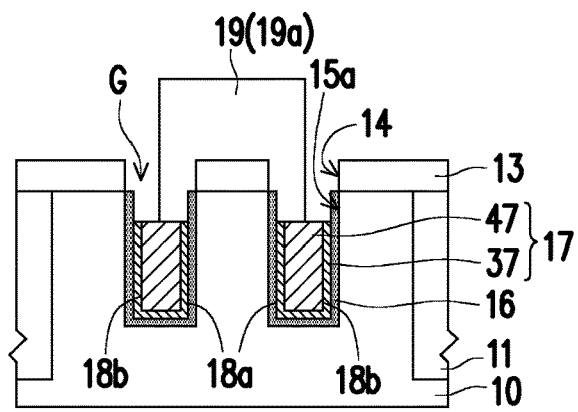
Figure 2C:
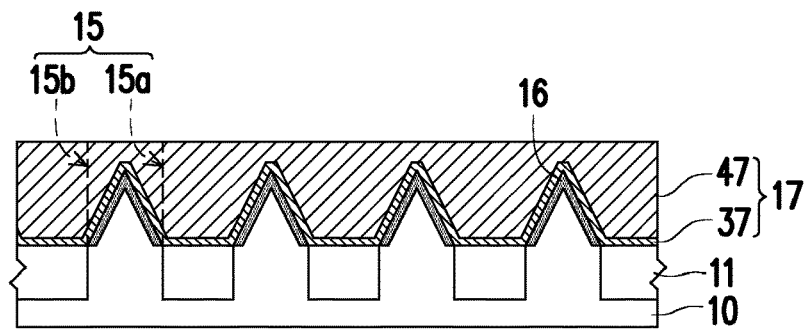

Referring to FIG. 2A, FIG. 2B, and FIG. 2C, a patterned mask layer 19 is formed on the substrate 10.

Referring to FIG. 2A, the patterned mask layer 19 covers the first side 18a of the buried word line 17 and expose the second side 18b of the buried word line 17. More specifically, the patterned mask layer 19 includes a plurality of mask patterns 19a. Each of the mask patterns 19a is extended along the first direction D1 and covers the surfaces of the first conductive layer 37 and the second conductive layer 47 of the first side 18a of the buried word lines 17 passing through the same active region column R1 or R2. Each of the mask patterns 19a further covers the gate dielectric layer 16 on the sidewall of the first side 18a thereof, and the patterned hard mask layer 13 on the active regions 12 and the isolation structures 11 between the two buried word lines 17. A gap G between the mask pattern 19a and the adjacent patterned hard mask layer 13 exposes the surfaces of the first conductive layer 37 and the second conductive layer 47 of the second side 18b of the buried word line 17 and exposes the gate dielectric layer 16 on the sidewall of the second side 18b of the buried word line 17. In some embodiments, the ratio of a width L of each of the mask patterns 19a and a distance S between two adjacent mask patterns 19a is between 1:1.5 and 1:2.5. In an exemplary embodiment, the width L of each of the mask patterns 19a is, for instance, 54 nm, and the distance S between two adjacent mask patterns 19a is, for instance, 106 nm, but the invention is not limited thereto. The value of the width L and the distance S are dependent on the word line pitch according to technology node.

Figure 2D:
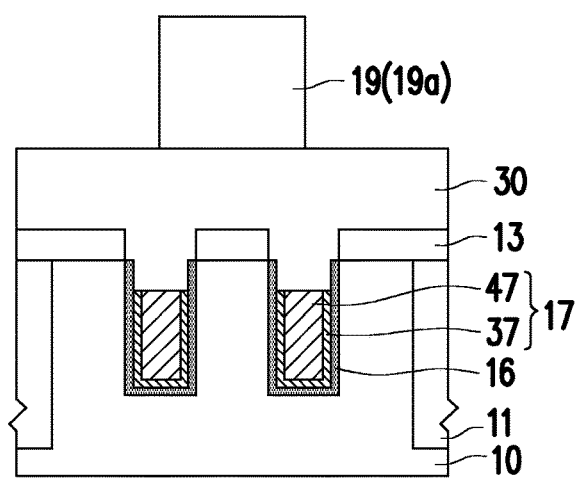

Referring to FIG. 2D, in some other exemplary embodiments, before the patterned mask layer 19 is formed, an insulating layer 30 is further formed to cover the surface of the substrate 10 and be filled in the trench 15. The insulating layer 30 can be a single-layer or multilayer structure, and the material thereof can be the same as or different from the material of the patterned hard mask layer 13.

Figure 3A:
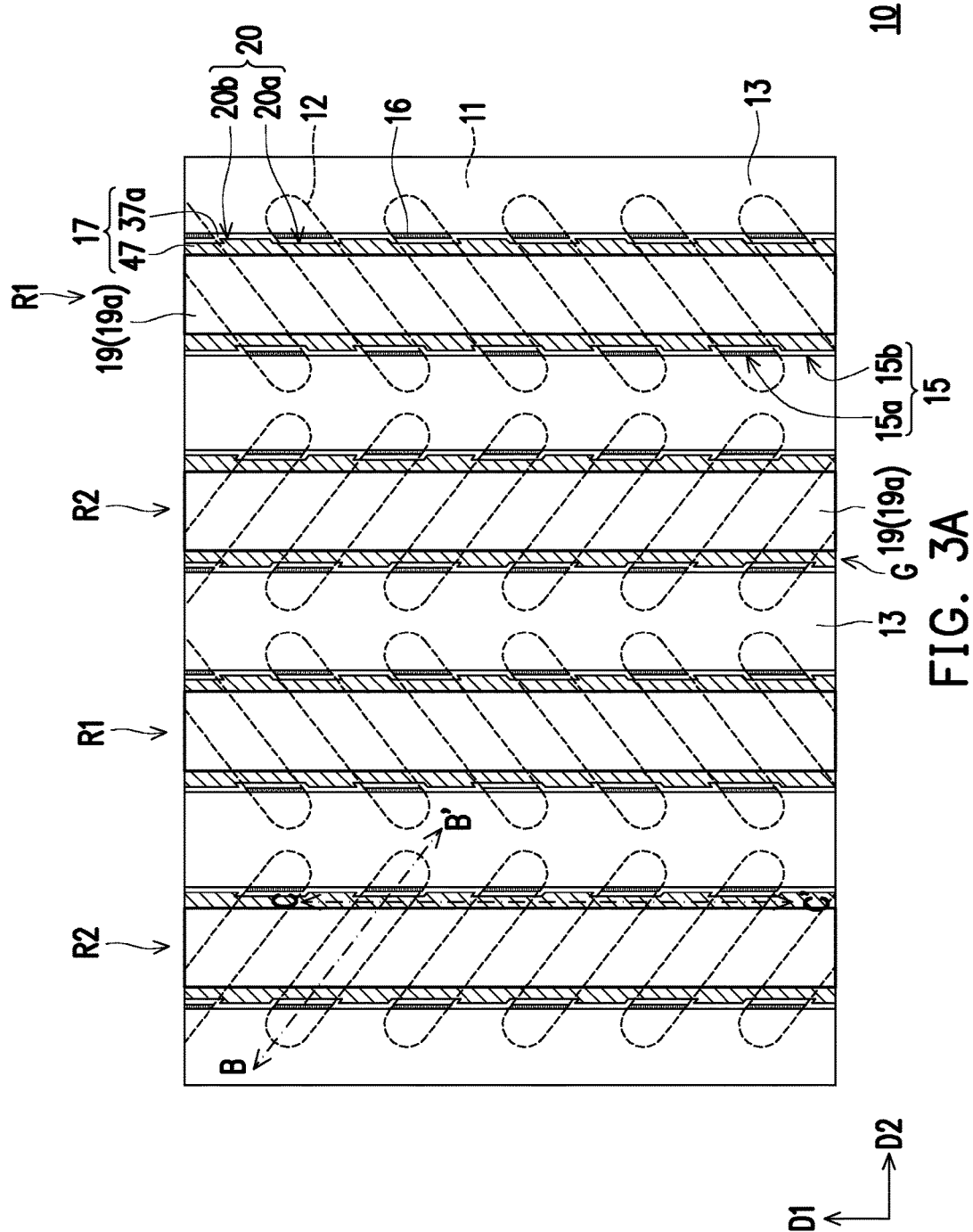
Figure 3B:
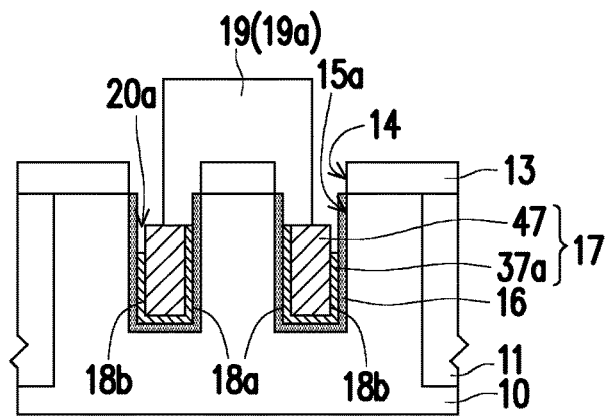
Figure 3C:
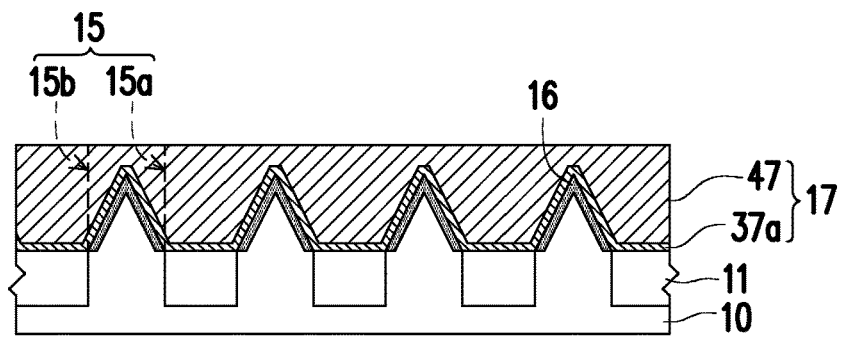

Referring to FIG. 3A, FIG. 3B, and FIG. 3C, using the patterned mask layer 19 and the patterned hard mask layer 13 as a mask, a portion of the first conductive layer 37 exposed by the gap G is removed to form a first conductive layer 37a having a recess 20. The recess 20 is on the first conductive layer 37a of the second side 18b of the buried word line 17, and the recess 20 is not on the first conductive layer 37a of the first side 18a of the buried word line 17. In other words, the buried word line 17 is an asymmetric structure. At the first side 18a of the buried word line 17, since the first conductive layer 37 is covered by the patterned mask layer 19 and is not removed, the height thereof is greater; and at the second side 18b of the buried word line 17, since the first conductive layer 37 is not covered by the patterned mask layer 19 and is partially removed, the height thereof is lower. The removal method is, for instance, etching, and the etching includes dry etching. The etchant for dry etching is, for instance, an etchant having high selectivity between the first conductive layer 37 and the second conductive layer 47 and high selectivity between the first conductive layer 37 and the gate dielectric layer 16. The dry etching is, for instance, a mixed gas of a halogen gas and an inert gas. In some embodiments, the dry etching adopts a mixed gas of fluorine gas and argon gas. Next, the patterned mask layer 19 is removed, and the removal method is, for instance, an ashing process (such as an oxygen plasma ashing process), a wet removal process, or a combination thereof.

Figure 3D:
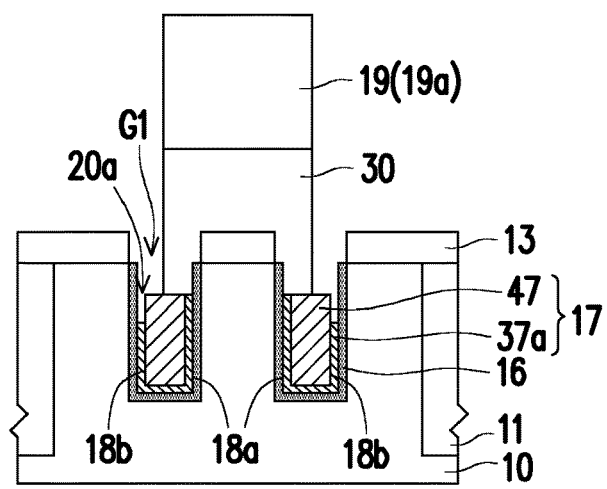

In some embodiments (FIG. 3D) in which the insulating layer 30 is below the patterned mask layer 19, the patterning process includes etching the insulating layer 30 not covered by the mask layer 19 using the patterned mask layer 19 as a mask to expose the patterned mask layer 13. Next, a portion of the first conductive layer 37 exposed by a gap G1 (i.e., the second side 18b of the buried word line 17) between the patterned mask layer 19 and the patterned mask layer 13 is etched using the patterned mask layer 19 and the patterned mask layer 13 as a mask, so as to form the first conductive layer 37a having the recess 20. Next, the patterned mask layer 19 and the insulating layer 30 are removed.

Referring further to FIG. 3B, in some embodiments, the cross section of the recess 20 is rectangular, square, circular, oval, or a combination thereof. Referring further to FIG. 3A, the recess 20 is extended along the first direction D1 and passes through the active regions 12 and the isolation structures 11. The recess 20 includes a first recess 20a and a second recess 20b connected to each other. The first recess 20a is located in the active regions 12; the second recess 20b is located in the isolation structures 11. In the active regions 12, the first recess 20a is located between the second conductive layer 47 of the buried word line 17 and the gate dielectric layer 16. Specifically, the bottom surface of the first recess 20a is the first conductive layer 37a of the buried word line 17, and the sidewall thereof is the second conductive layer 47 and the gate dielectric layer 16. In the isolation structures 11, the second recess 20b is located between the second conductive layer 47 of the buried word line 17 and the isolation structures 11. Specifically, the bottom surface of the second recess 20b is the first conductive layer 37 of the buried word line 17, and the sidewall of the second recess 20b is the second conductive layer 47 and the isolation structures 11. The sidewall at one side of the first recess 20a in the active regions 12 is the gate dielectric layer 16, and the sidewall at the same side of the second recess 20b in the isolation structures 11 is the isolation structures 11. Since the gate dielectric layer 16 and the isolation structures 11 are not coplanar, the top view of the recess 20 formed by the first recess 20a and the second recess 20b is a non-linear trench extended along the first direction D1, such as a winding trench.

Figure 4A:
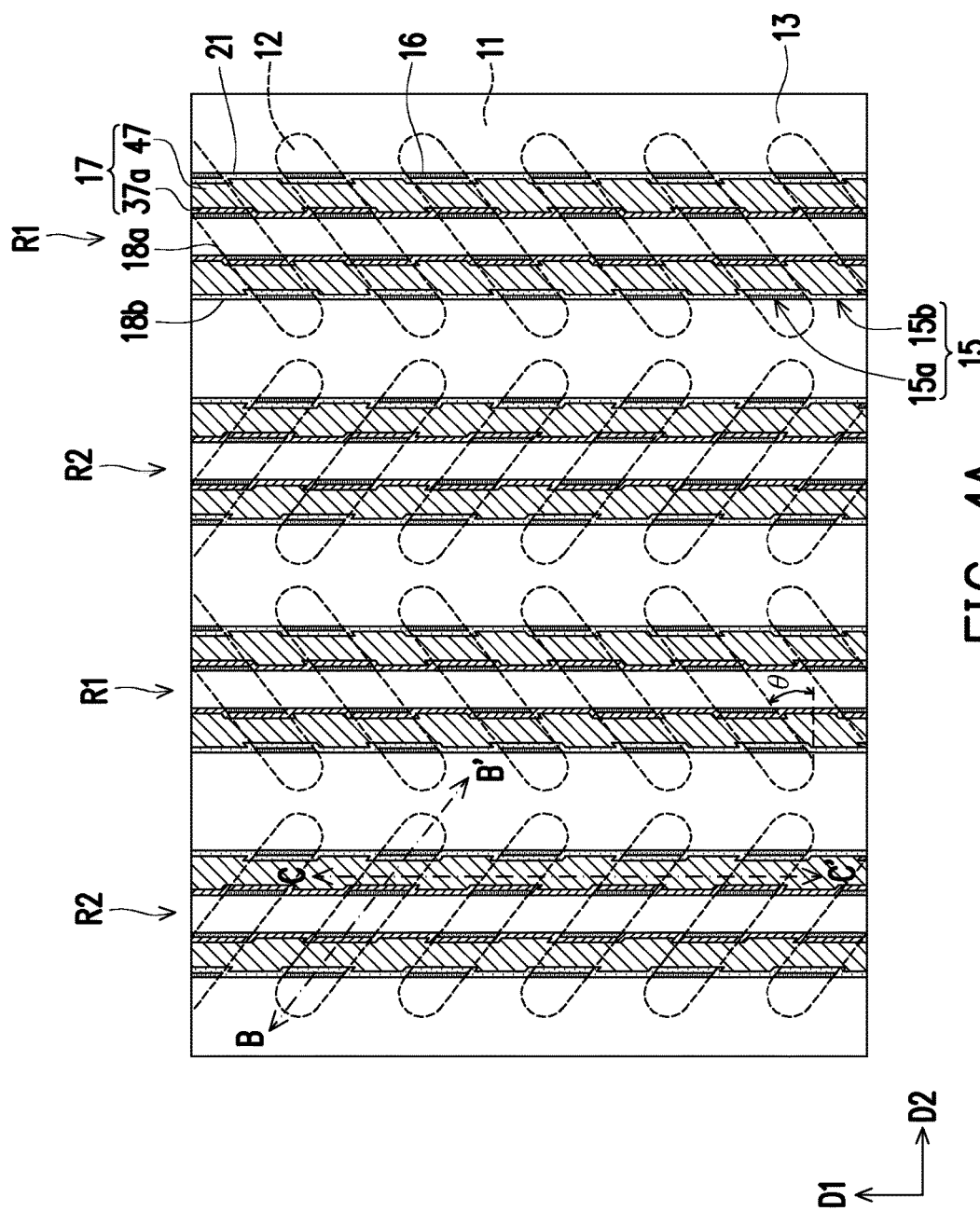
Figure 4B:
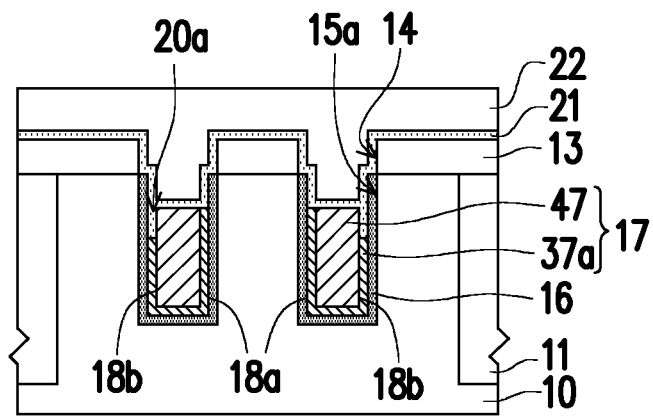
Figure 4C:
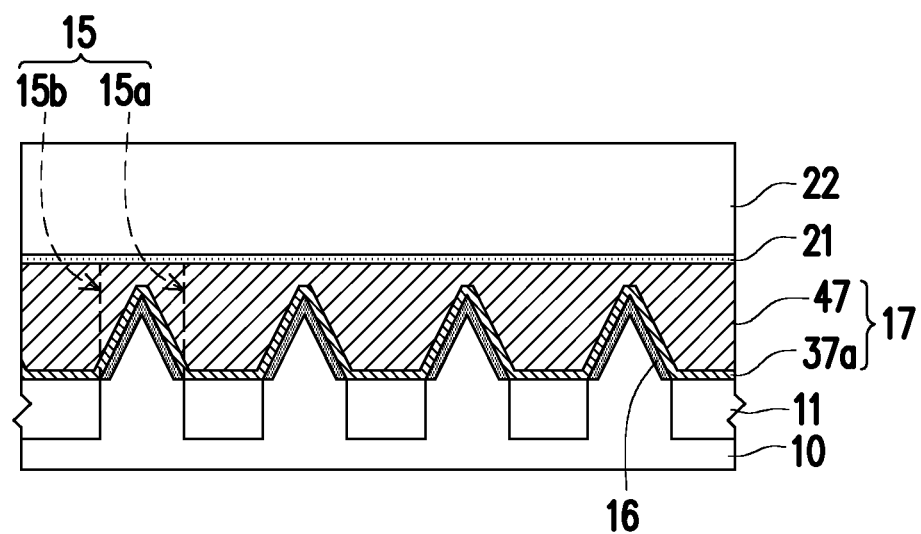

Referring to FIG. 4A, FIG. 4B, and FIG. 4C, a cap layer 21 is formed on the substrate 10. In some embodiments, the cap layer 21 covers the patterned mask layer 13 and is filled in the trench 15 to cover the surface of the buried word line 17 and is completely filled in the recess 20. The material of the cap layer 21 includes an insulation material. The insulation material is, for instance, silicon oxide, silicon nitride, silicon oxynitride, or a combination thereof. The cap layer 21 is formed by, for instance, a deposition having good step coverage such as an atomic layer deposition (ALD). Next, a dielectric layer 22 is formed on the cap layer 21 to cover the cap layer 21 and be completely filled in the trench 15.

Figure 5A:
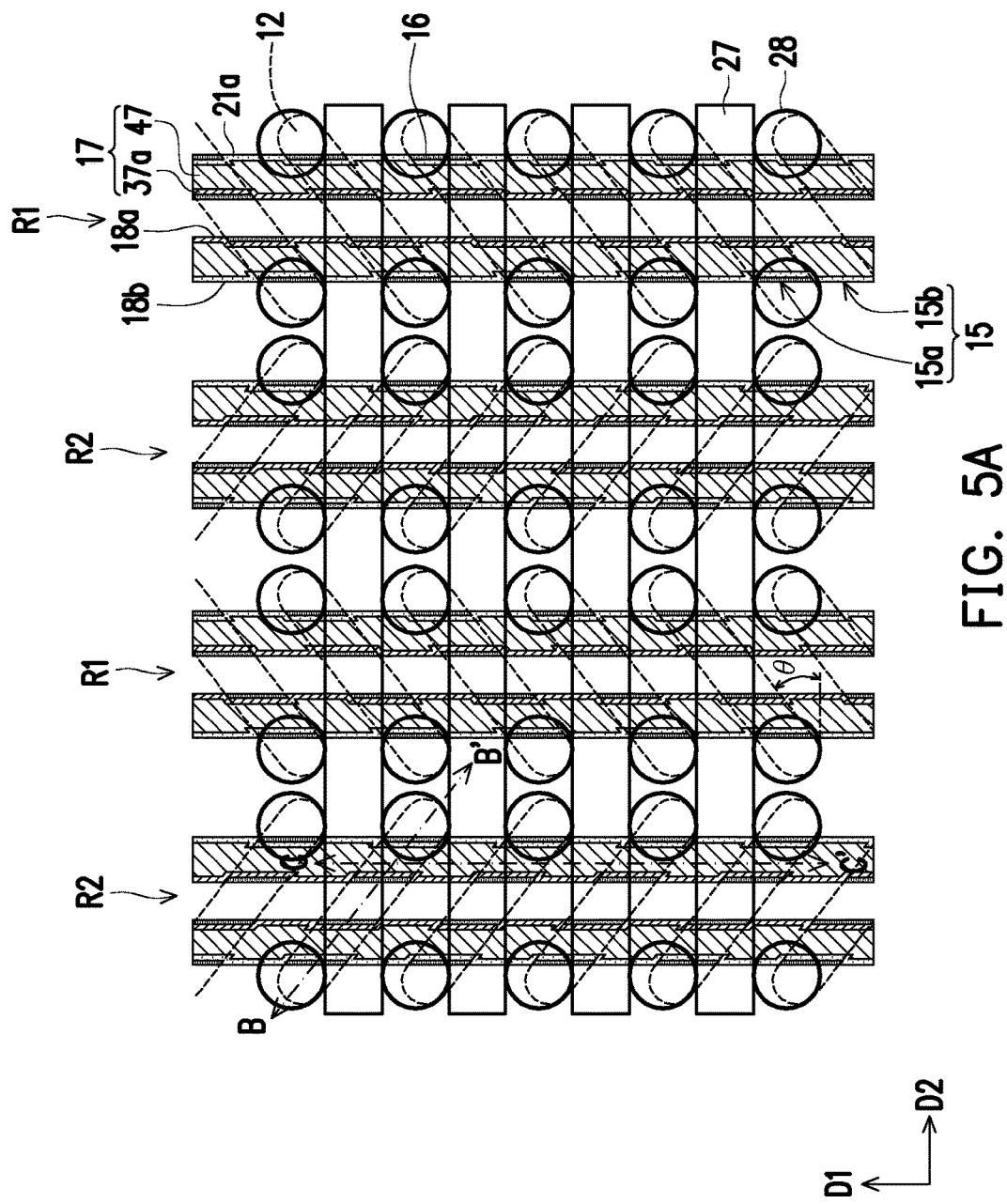
Figure 5B:
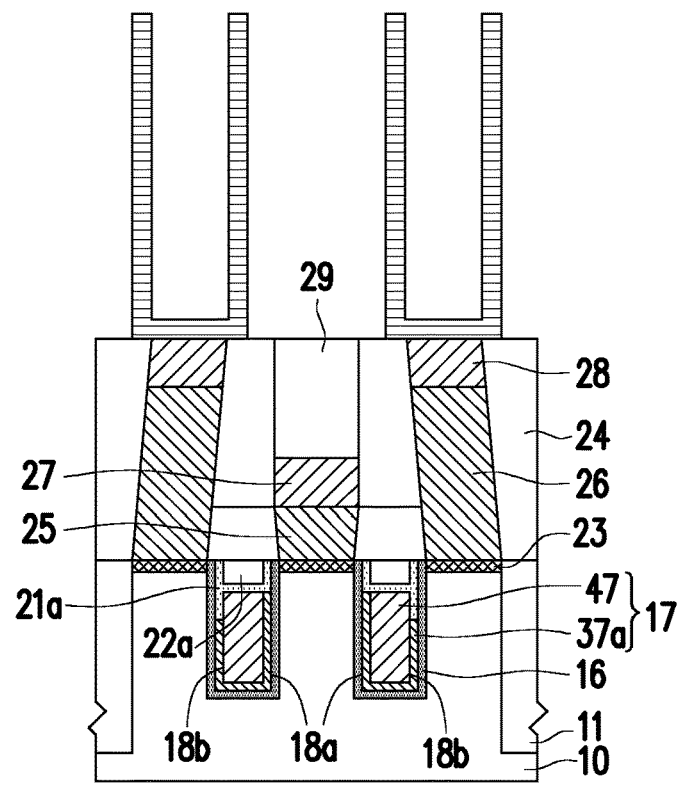
Figure 5C:
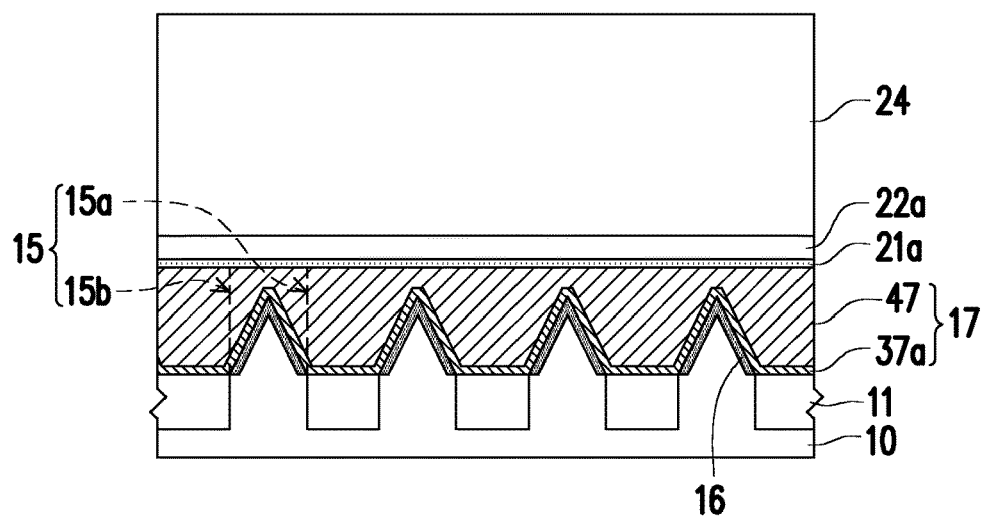

Referring to FIG. 5A, FIG. 5B, and FIG. 5C, the dielectric layer 22, the cap layer 21, and the patterned mask layer 13 on the surface of the substrate 10 are removed, and the dielectric layer 22a and the cap layer 21a are left. The dielectric layer 22a is extended along the first direction D1 and covers the cap layer 21a. The cap layer 21a covers the top surface of the second conductive layer 47, the top surface of the first conductive layer 37a, and a portion of the sidewall of the gate dielectric layer 16 of the buried word line 17 and is in contact with the above. In the present embodiment, the cap layer 21a is filled in the recess 20, and therefore the cap layer 21a of the second side of the buried word line 17 covers the top surface, the vertex, and a portion of the sidewall of the second conductive layer 47, the top surface of the first conductive layer 37a, and a portion of the sidewall of the gate dielectric layer 16 and is in contact with the above.

Next, other components are formed on the substrate 10. For instance, source and drain regions 23 are formed in the substrate 10 inside the active regions 12 at two sides of the buried word line 17. Next, a dielectric layer 24, bit line contacts 25, capacitor contacts 26, bit lines 27, capacitors 28, and a dielectric layer 29 are formed. The active region 12 at two sides of the buried word lines 17 includes a bit line contact 25 and a capacitor contact 26. The bit line 27 is electrically connected to one of the source and drain regions 23 of the active region 12 via the bit line contact 25. The capacitor 28 is electrically connected to the other of the source and drain regions 23 of the active region 12 via the capacitor contact 26.

Referring to FIG. 5A, the bit line 27 is located above the substrate 10, extended along the second direction D2, cross the isolation structures 11, the active regions 12, and the buried word line 17, and is arranged along the first direction D1. In some embodiments, the buried word line 17 and the bit line 27 are perpendicular to each other.

In the present embodiment, each of the active regions 12 is crossed by two of the buried word lines 17. The capacitor 28 is located in the active regions 12 at the second side 18b of the buried word line 17. The capacitors 28 of the same active region column R1/R2 are arranged in two columns along the first direction D1. Moreover, in some embodiments, two capacitors 28 adjacent along the first direction D1 of two adjacent active regions 12 in the same active region column R1 are arranged in a column with two capacitors 28 adjacent along the first direction D1 of two adjacent active regions 12 in the adjacent active region column R2. In other words, the capacitors 28 on the active region column R1 or R2 are arranged in an array. From another perspective, the capacitors 28 disposed at the second side 18b of the buried word line 17 are arranged in a column along the first direction D1 and are alternately arranged with the word lines 27. The capacitors 28 disposed at the same side of the bit line 27 are arranged in a row along the second direction D2. In the same active region column R1/R2, two capacitors 28 in the same row are located on different active regions 12 and at the second side 18b of two adjacent bit lines 27.

Referring to FIG. 5B and FIG. 5C, in the dynamic random access memory of the present embodiment, the height of the top surface of the buried word line at the second side thereof is lower than the height of the top surface of the buried word line at the first side. As a result, GIDL can be reduced to improve refresh performance. Moreover, since the recess is only formed by removing a portion of the first conductive layer of the second side of the buried word line and the second conductive layer is not removed, the resistance of the buried word line is not significantly affected, and therefore the performance of the write recovery time (tWR) thereof can also be maintained.

Figure 6A:
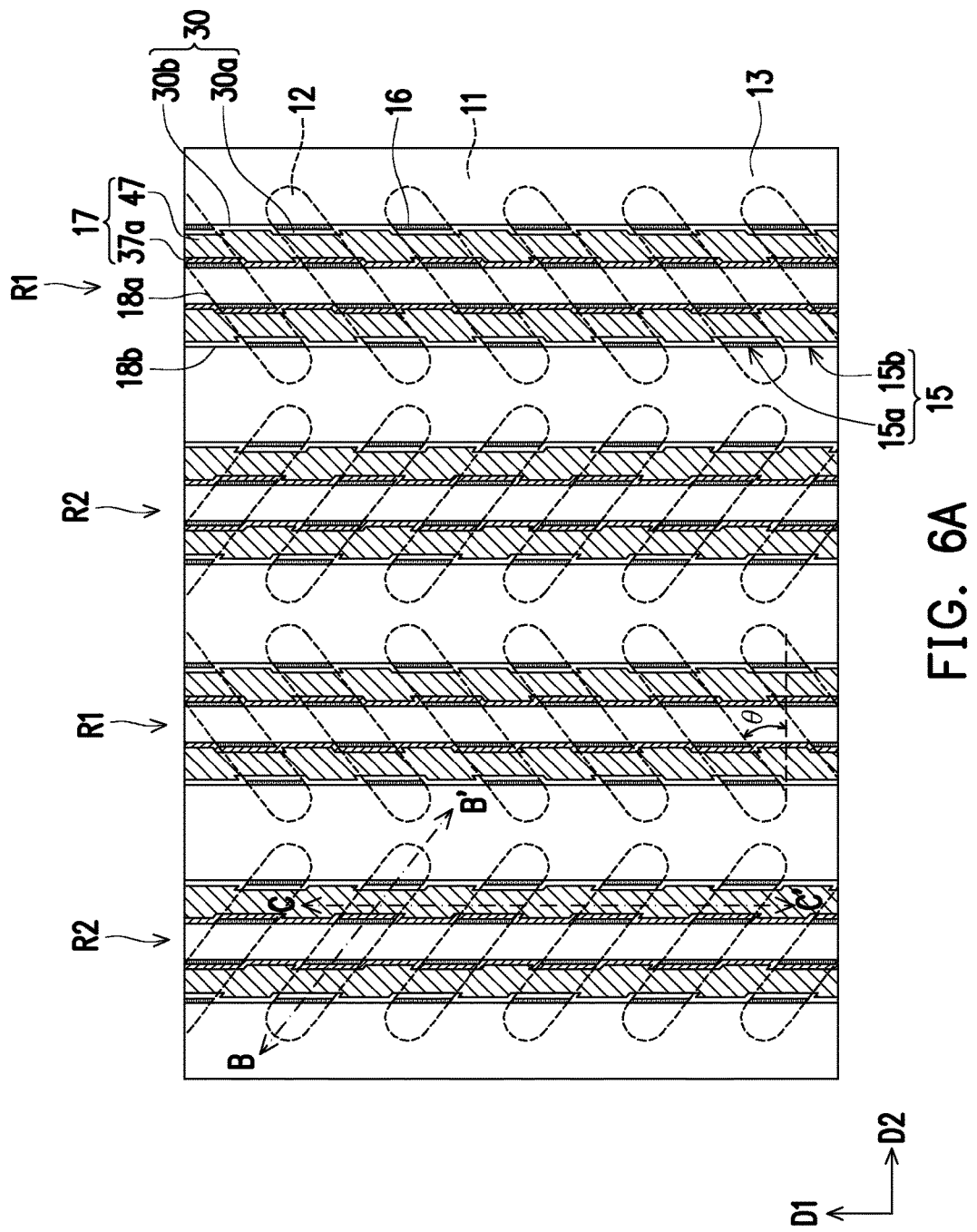
FIG. 6A is top view of the second embodiment of the method of fabricating a dynamic random access memory according to the invention.
Figure 6B:
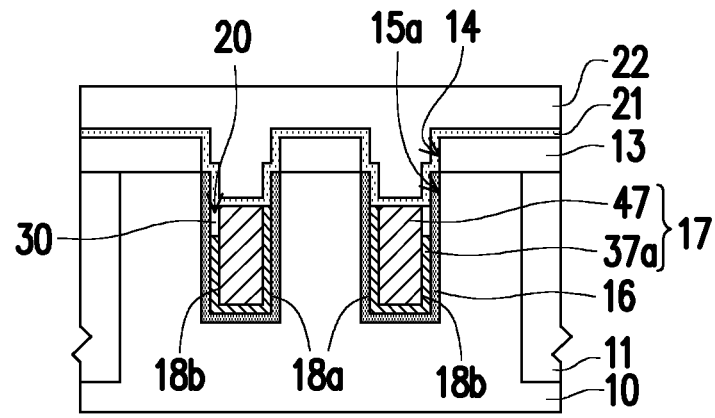
FIG. 6B is cross-sectional diagram along line B-B' in FIG. 6A.
Figure 6C:
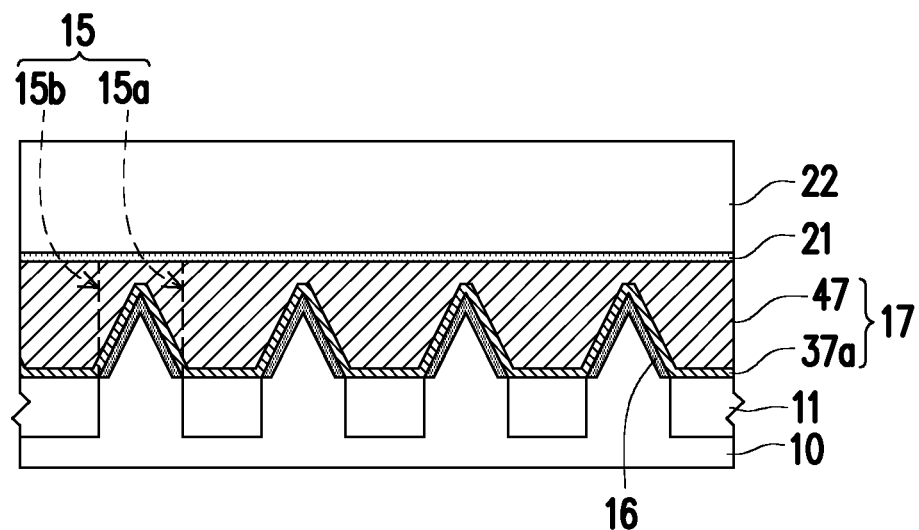
FIG. 6C is cross-sectional diagram along line C-C' in FIG. 6A.

Referring to FIG. 6A to FIG. 6C, for the sake of clarity, the cap layer 21/21a and the dielectric layer 22/22a are not shown in FIG. 6A. The difference between the second embodiment and the first embodiment is that the cap layer 21 is not completely filled in the recess 20 and only covers the top thereof, and an air gap 30 is formed at the recess 20 between the cap layer 21 and the first conductive layer 37. The detailed description is as follows.

Referring to FIG. 6A, FIG. 6B, and FIG. 6C, after the recess 20 is formed in the buried word line 17 in correspondence to FIG. 3, FIG. 3B, and FIG. 3C in the first embodiment, the cap layer 21 is formed on the substrate 10. The cap layer 21 covers the top of the substrate 10 and is filled in the trench 15, and covers the sidewall of the trench 15 and the bottom portion of the trench 15. In the present embodiment, the cap layer 21 is not completely filled in the recess 20 and is not even filled in the recess 20 at all, such that an air gap 30 is formed on the first conductive layer 37a. In the present embodiment, the cap layer 21 is formed by a deposition having worse step coverage, for instance, a CVD such as a plasma-enhanced chemical vapor deposition (PECVD). Next, a dielectric layer 22 is formed on the cap layer 21 to cover the top of the substrate 10 and be filled in the trench 15. The dielectric layer 22 is formed by, for instance, a CVD.

Referring to FIG. 6B, the air gap 30 includes a first air gap 30a and a second air gap 30b. The first air gap 30a is formed inside the first recess 20a in the active regions 12; and the second air gap 30b is formed inside the second recess 20b in the isolation structures 11. In some embodiments, a gas such as air or an inert gas can be filled in the air gap 30. However, the invention is not limited thereto, and in some other embodiments, the air gap 30 can also be vacuum, but may not be high vacuum.

Referring to FIG. 6A, in some embodiments, the air gap 30 is located at the second side 18b of the buried word line 17, extended along the first direction, and passes through the active regions 12 and the isolation structures 11. The cross section of the air gap 30 along line B-B' is rectangular, square, circular, oval, or a combination thereof. In some embodiments, the air gap 30 and the buried word line 17 are substantially parallel, and the quantities of the two are the same.

Referring further to FIG. 6A, FIG. 6B, and FIG. 6C, the air gap 30 includes a first air gap 30a located in the active regions 12 and a second air gap 30b located in the isolation structures 11. In the active regions 12, the first air gap 30a is surrounded and covered by the buried word line 17, the gate dielectric layer 16, and the cap layer 21. Specifically, in the active regions 12, the bottom surface of the first air gap 30a is the first conductive layer 37a, the top surface thereof is the cap layer 21, and the two sidewalls thereof are the second conductive layer 47 and the gate dielectric layer 16. In the isolation structures 11, the second air gap 30b is surrounded and covered by the buried word line 17, the isolation structures 11, and the cap layer 21. More specifically, in the isolation structures 11, the bottom surface of the air gap 30 is the first conductive layer 37, the top surface thereof is the cap layer 21, and the two sidewalls thereof are the second conductive layer 47 and the isolation structures 11.

Next, processes similar to FIG. 5A to FIG. 5C in the first embodiment may be performed.

The dynamic random access memory of the present embodiment has an air gap, and air gap is formed at one side of the buried word line, such that the electric field between the buried word line and the source and drain regions at the one side thereof is reduced, and GIDL is better reduced to improve the refresh performance thereof.

Figure 7A:
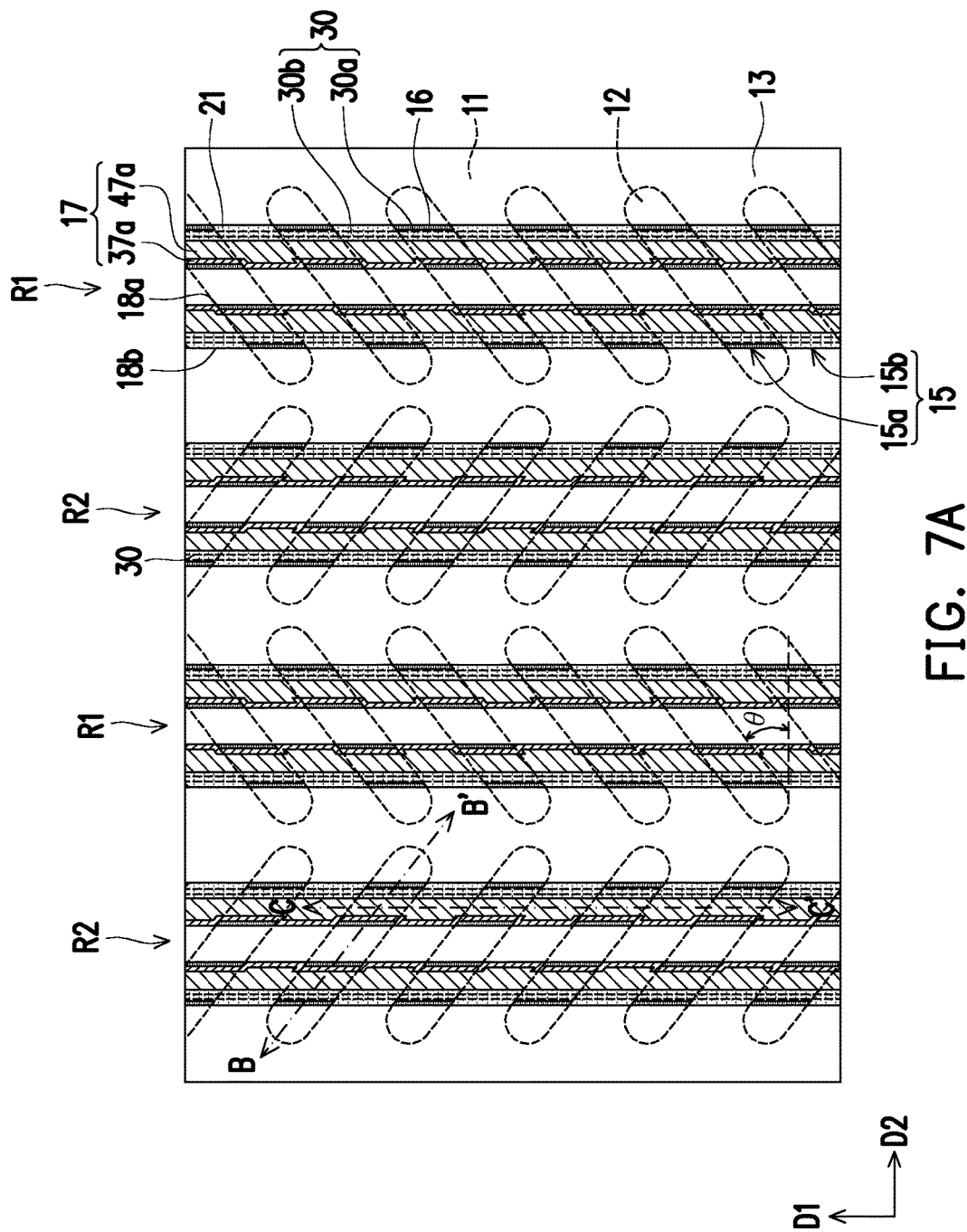
FIG. 7A is top view of the third embodiment of the method of fabricating a dynamic random access memory according to the invention.
Figure 7B:
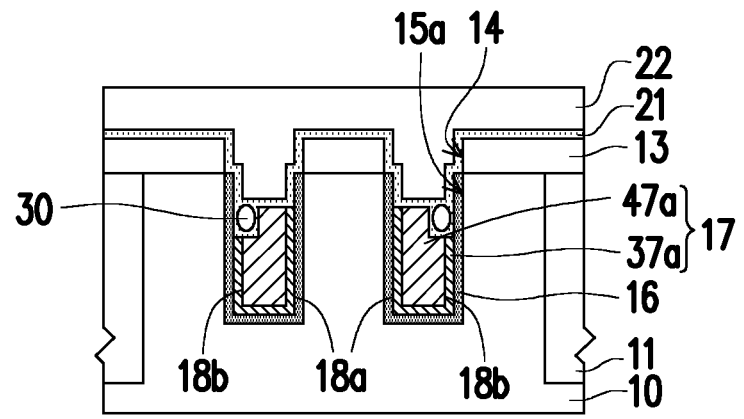
FIG. 7B is cross-sectional diagram along line B-B' in FIG. 7A.
Figure 7C:
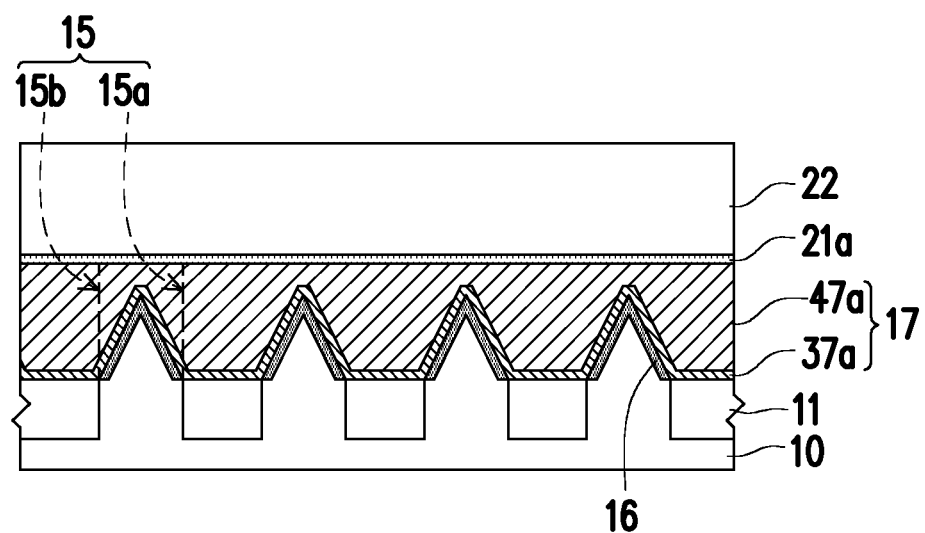
FIG. 7C is cross-sectional diagram along line C-C' in FIG. 7A.

Referring to FIG. 7A to FIG. 7C, for the sake of clarity, the cap layer 21/21a outside the recess 20 and the dielectric layer 22/22a are not shown in FIG. 7A. The difference between the third embodiment and the first/second embodiments is that when the recess 20 is formed, a portion of the second conductive layer 47 of the second side 18b of the buried word line 17 is also removed. Moreover, the resulting air gap 30 is surrounded and covered by the cap layer 21. The detailed description is as follows.

Referring to FIG. 7A, FIG. 7B, and FIG. 7C, after the step of forming the patterned mask layer 19 on the first side 18a of the buried word line 17 corresponding to FIG. 2A, FIG. 2B, and FIG. 2C based on the first embodiment, a portion of the first conductive layer 37 and a portion of the second conductive layer 47 of the second side 18b of the buried word line 17 are removed using the patterned mask layer 19 and the patterned hard mask layer 13 as a mask, so as to form the first conductive layer 37a and a portion of the second conductive layer 47a having the recess 20. The removal method is, for instance, etching, and the etching includes dry etching. In some embodiments, the dry etching adopts, for instance, an etchant having a lower etch selectivity for the first conductive layer 37 and the second conductive layer 47. The etch selectivity ratio of the first conductive layer 37 to the second conductive layer 47 is about 1, such as 1:1-3:1. In some exemplary embodiments, the etchant is, for instance, $Cl_2$ gas.

Referring to FIG. 7A, FIG. 7B, and FIG. 7C, the recess 20 includes a first recess 20a located in the active regions 12 and a second recess 20b located in the isolation structures 11. The difference from the first and second embodiments is that, the bottom surface of the recess 20 includes a first conductive layer 37a and a second conductive layer 47a. Specifically, in the active regions 12, the bottom surface of the first recess 20a is the first conductive layer 37a and the second conductive layer 47a, and the two sidewalls thereof are the second conductive layer 47a and the gate dielectric layer 16. In the isolation structures 11, the bottom surface of the second recess 20b is the first conductive layer 37a and the second conductive layer 47a, and the two sidewalls thereof are the second conductive layer 47a and the isolation structures 11. The resulting recess 20 can have a planar bottom surface or a stepped bottom surface (not shown) based on the different etching properties of the etchant for the first conductive layer 37 and the second conductive layer 47.

Referring to FIG. 7B, next, a cap layer 21 is formed. In some embodiments, the cap layer 21 covers the buried word line 17 and is partially filled in the recess 20, but is not completely filled in the recess 20 and only covers the bottom portion, the sidewall, and the top of the recess 20, i.e., the cap layer 21 surrounds and covers the recess 20 to form the air gap 30. In some other embodiments, the cap layer 21 is not filled in the recess 20, and similarly to the second embodiment, only covers the top of the recess 20. Correspondingly, the air gap 30 includes a first air gap 30a and a second air gap 30b. More specifically, the first air gap 30a is formed in the first recess 20a in the active regions 12, and the second air gap 30b is formed in the second recess 20b of the isolation structures 11. The method of forming the cap layer 21 is the same as the second embodiment, and adopts, for instance, a deposition having worse step coverage. Then, a dielectric layer 22 is formed on the cap layer 21.

Referring to FIG. 7A, FIG. 7B, and FIG. 7C, the air gap 30 is located at the second side 18b of the buried word line 17 and surrounded and covered by the cap layer 21, extended along the first direction, and passes through the active regions 12 and the isolation structures 11. In other words, the air gap 30 includes a first air gap 30a located in the active regions 12 and a second air gap 30b located in the isolation structures 11. In the active regions 12, the first air gap 30a is located between the buried word line 17 and the gate dielectric layer 16. In the isolation structures 11, the second air gap 30b is located between the buried word line 17 and the isolation structures 11. Since the air gap 30 is extended along the first direction, the air gap 30 can also be referred to as an air tunnel.

Next, processes similar to FIG. 5A to FIG. 5C in the first embodiment may be performed.

In the present embodiment, when a recess is formed, a portion of the first conductive layer and a portion of the second conductive layer are removed at the same time, and therefore a subsequently formed air gap is greater than the air gap of the second embodiment, such that the electric field between the buried word line and the source and drain regions at a side thereof can be further reduced to reduce GIDL and improve the refresh performance thereof.

Based on the above, the buried word line of the dynamic random access memory of the invention has an asymmetric structure, and a portion of the conductive layer at the second side of the buried word line is removed, such that the height thereof is lower than the height of the conductive layer of the first side. As a result, GIDL is reduced and the refresh performance thereof is improved. In some embodiments, an air gap is formed above the conductive layer having a lower height at the second side of the buried word line, such that the electric field between the buried word line and the source and drain regions at the sides thereof can be reduced to further reduce GIDL and improve the refresh performance thereof. Moreover, since only a portion of the conductive layer at a side of the buried word line is removed, the resistance of the buried word line is not significantly affected, and therefore the performance of the write recovery time (tWR) thereof may also be maintained.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A dynamic random access memory, comprising:
a substrate;
a plurality of isolation structures located in the substrate to define a plurality of active regions arranged along a first direction, wherein the substrate has a trench extended along the first direction and passing through the plurality of isolation structures and the plurality of active regions;
a buried word line disposed in the trench, wherein the buried word line is extended along the first direction and passes through the plurality of active regions and the plurality of isolation structures;
a plurality of gate dielectric layers located in the plurality of active regions, wherein the plurality of gate dielectric layers covers a surface of a portion of the trench and surrounds and covers the buried word line; and
a cap layer covering the buried word line,
wherein a height of a top surface of a second side of the buried word line is lower than a height of a top surface of a first side of the buried word line passing through the plurality of active regions and the plurality of isolation structures.

2. The dynamic random access memory of claim 1, wherein the buried word line comprises a first conductive layer and a second conductive layer, and
the second conductive layer is located in the trench; and
the first conductive layer surrounds and covers a bottom surface and a portion of a sidewall of the second conductive layer, and a height of a top surface of the first conductive layer of the second side of the buried word line is less than a height of a top surface of the first conductive layer of the first side of the buried word line.

3. The dynamic random access memory of claim 2, wherein the cap layer is in contact with the top surface of the first conductive layer of the first side of the buried word line and in contact with the top surface of the first conductive layer of the second side of the buried word line.

4. The dynamic random access memory of claim 2, wherein the cap layer is not in contact with the top surface of the first conductive layer of the second side of the buried word line and an air gap is formed therebetween.

5. The dynamic random access memory of claim 2, wherein a height of a top surface of the second conductive layer of the second side of the buried word line is less than a height of a top surface of a portion of the second conductive layer of the first side of the buried word line.

6. The dynamic random access memory of claim 2, wherein an air gap is above the first conductive layer and the second conductive layer of the second side of the buried word line, and the air gap is surrounded and covered by the cap layer.

7. The dynamic random access memory of claim 2, further comprising a plurality of capacitors located at the second side of the buried word line and electrically connected to the plurality of active regions.

8. The dynamic random access memory of claim 2, wherein a recess is above the top surface of the second side of the buried word line and extended along and passes through the plurality of active regions and the plurality of isolation structures.

9. The dynamic random access memory of claim 8, wherein the cap layer is not completely filled in the recess.

10. The dynamic random access memory of claim 8, wherein the cap layer covers a sidewall and a bottom surface of the recess, and an air gap is formed therein.

* * * * *